United States Patent
Luo et al.

(10) Patent No.: US 11,885,005 B2
(45) Date of Patent: Jan. 30, 2024

(54) MASK AND MANUFACTURING METHOD THEREFOR, AND MANUFACTURING METHOD FOR DISPLAY SUBSTRATE

(71) Applicants: Chengdu BOE Optoelectronics Technology Co., Ltd., Sichuan (CN); BOE TECHNOLOGY GROUP CO., LTD., Beijing (CN)

(72) Inventors: Chang Luo, Beijing (CN); Fengli Ji, Beijing (CN); Jianpeng Wu, Beijing (CN); Zhongying Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 690 days.

(21) Appl. No.: 16/963,673

(22) PCT Filed: Oct. 16, 2019

(86) PCT No.: PCT/CN2019/111495
§ 371 (c)(1),
(2) Date: Jul. 21, 2020

(87) PCT Pub. No.: WO2021/072681
PCT Pub. Date: Apr. 22, 2021

(65) Prior Publication Data
US 2022/0002859 A1    Jan. 6, 2022

(51) Int. Cl.
*C23C 14/04* (2006.01)
*H10K 71/16* (2023.01)

(52) U.S. Cl.
CPC ......... *C23C 14/042* (2013.01); *H10K 71/166* (2023.02)

(58) Field of Classification Search
CPC ......... C23C 14/042; C23C 14/24; C23F 1/00; H10K 71/166
See application file for complete search history.

(56) References Cited

U.S. PATENT DOCUMENTS

2006/0158088 A1* 7/2006 Kim ............... C23C 14/042
                                                    438/22
2014/0331925 A1   11/2014 Han

FOREIGN PATENT DOCUMENTS

| CN | 104141106 A | 11/2014 |
| CN | 107142450 A | 9/2017 |

(Continued)

OTHER PUBLICATIONS

WIPO: English Translation of the Written Opinion of the International Search Authority (Year: 2022).*

(Continued)

*Primary Examiner* — Lee A Holly
(74) *Attorney, Agent, or Firm* — Collard & Roe, P.C.

(57) ABSTRACT

A mask, a manufacturing method therefor, and a manufacturing method for a display substrate are provided. The mask includes: a first clamping region and a second clamping region, which are opposite to each other in a first direction, and at least one mesh region between the first clamping region and the second clamping region, the mesh region is in a first shape, in a case where the mask is stretched in the first direction, the mesh region is in a target shape, the target shape is different from the first shape, and the target shape includes a polygon shape, a circle shape, or an ellipse shape.

14 Claims, 12 Drawing Sheets

(56) References Cited

FOREIGN PATENT DOCUMENTS

| CN | 107994136 A | 5/2018 |
| CN | 108281575 A | 7/2018 |
| CN | 108796435 A | 11/2018 |
| CN | 109002623 A | 12/2018 |
| CN | 109402558 A | 3/2019 |
| CN | 108796435 B | * 6/2020 ........... C23C 14/042 |

OTHER PUBLICATIONS

International Search Report of PCT/CN2019/111495 in Chinese, dated Jul. 16, 2020.
Notice of Transmittal of the International Search Report of PCT/CN2019/111495 in Chinese, dated Jul. 16, 2020.
Written Opinion of the International Searching Authority of PCT/CN2019/111495 in Chinese, dated Jul. 16, 2020.

* cited by examiner

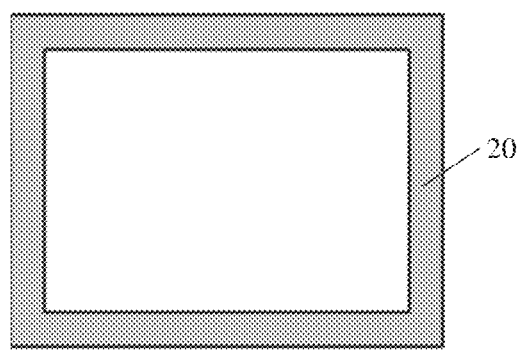
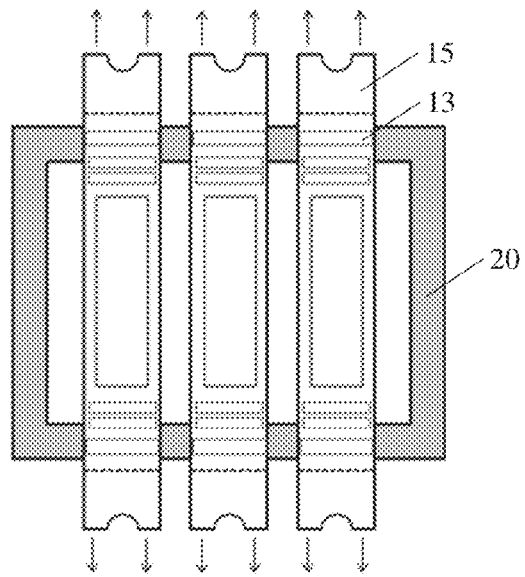
FIG. 3A
FIG. 3B
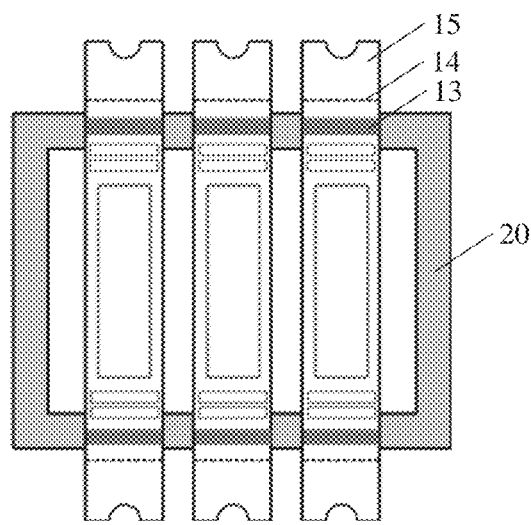
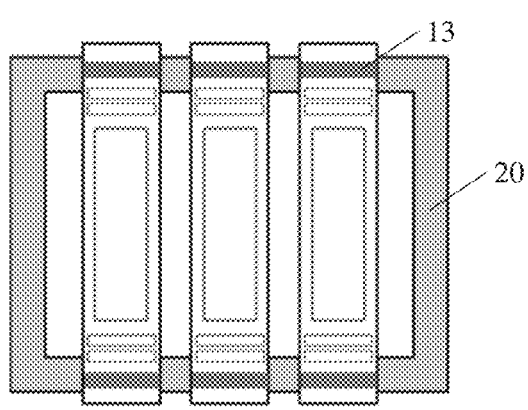
FIG. 3C
FIG. 3D

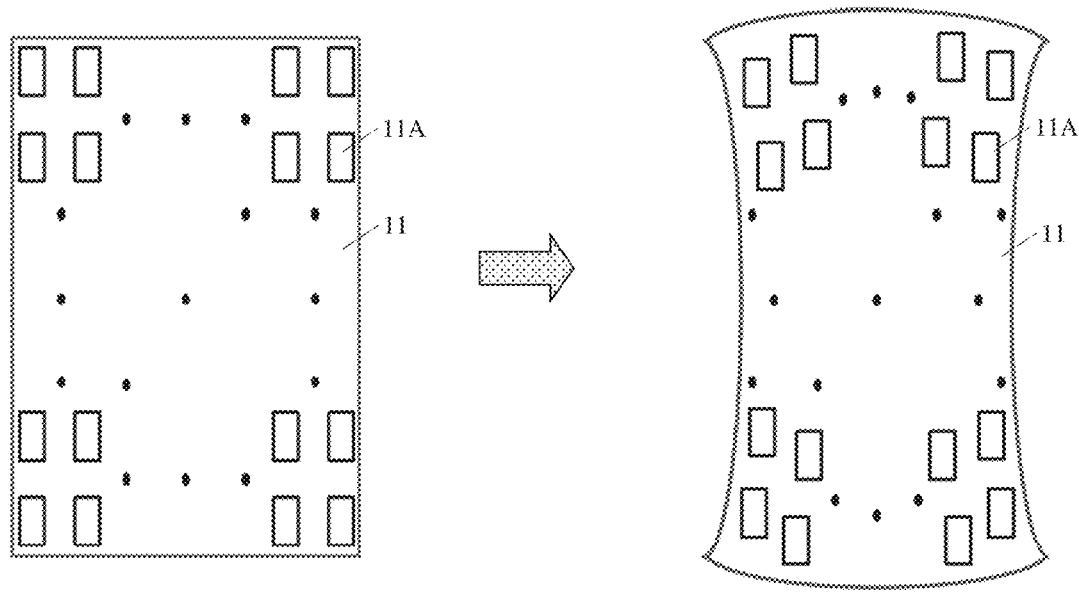

FIG. 4B

```
Providing a test mask plate, the test mask plate comprising a first        ─ S101
clamping region and a second clamping region, which are opposite to
each other in a first direction, and further comprising at least one mesh
region between the first clamping region and the second clamping region Acquiring deformation state information of the mesh region in a case       ─ S102
where the test mask plate is stretched along the first direction Acquiring reverse compensation information for the mesh region             ─ S103
according to the deformation state information, and obtaining target initial
state information of the mesh region based on the reverse compensation
information Manufacturing a mask plate according to the target initial state           ─ S104
information
```

FIG. 5A

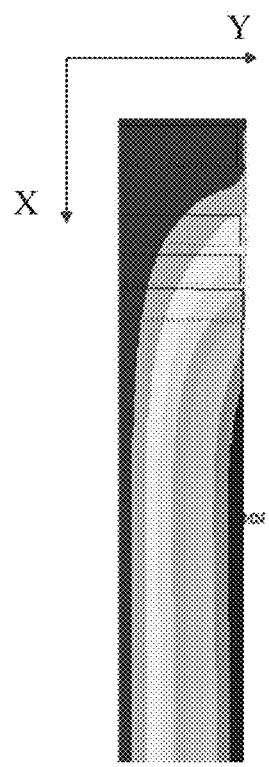
FIG. 6A
FIG. 6B
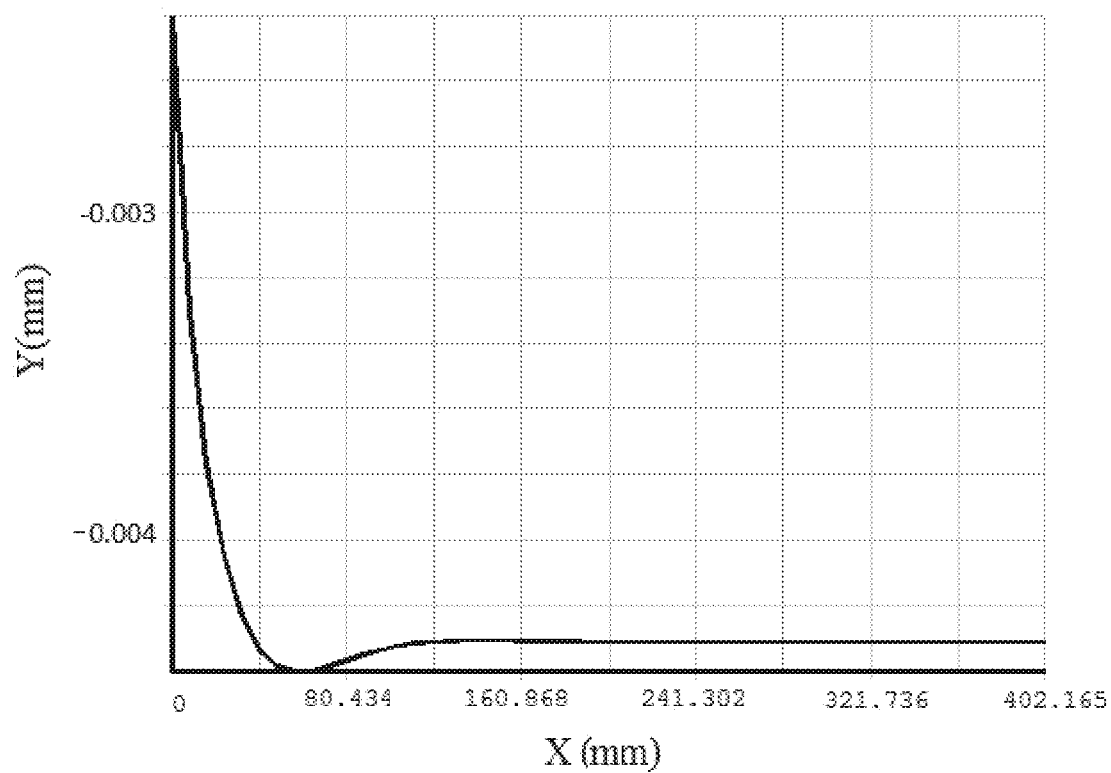

MASK AND MANUFACTURING METHOD THEREFOR, AND MANUFACTURING METHOD FOR DISPLAY SUBSTRATE

CROSS REFERENCE TO RELATED APPLICATIONS

This application is the National Stage of PCT/CN2019/111495 filed on Oct. 16, 2019, the disclosure of which is incorporated by reference.

TECHNICAL FIELD

Embodiments of the present disclosure relate to a mask and a manufacturing method therefor, and a manufacturing method for a display substrate.

BACKGROUND

Organic light emitting diode (OLED) display devices have a series of advantages such as self-luminescence, high contrast, high definition, wide viewing angle, low power consumption, fast response speed, and low manufacturing cost, and have become one of important development directions of a new generation of display devices, and thus have received more and more attention.

Functional layers such as organic light emitting materials of the OLED display device are usually prepared by vapor deposition or other methods using a fine metal mask (FMM). Therefore, the fineness of the FMM determines the formation accuracy of the functional layers such as the organic light emitting materials.

SUMMARY

At least one embodiment of the present disclosure provides a mask, and the mask comprises: a first clamping region and a second clamping region, which are opposite to each other in a first direction, and at least one mesh region between the first clamping region and the second clamping region, the mesh region is in a first shape, in a case where the mask is stretched along the first direction, the mesh region is in a target shape, the target shape is different from the first shape, and the target shape comprises a polygon shape, a circle shape, or an ellipse shape.

For example, in the mask provided by at least one embodiment of the present disclosure, the first shape comprises: a first side and a second side, which extend substantially along the first direction and are oppositely arranged, and a third side and a fourth side, which are connected between the first side and the second side; the first side and the second side protrude toward a direction away from a center of the first shape, and the third side and fourth side are recessed toward a direction close to the center of the first shape.

For example, in the mask provided by at least one embodiment of the present disclosure, the first side comprises a first end, a second end, and a first midpoint, between the first end and the second end, the second side comprises a third end, a fourth end, and a second midpoint between the third end and the fourth end, a connection line between the first midpoint and the second midpoint is a first connection line, the first connection line is perpendicular to the first direction, a length of the first connection line is greater than a length of a connection line between the first end and the third end, and the length of the first connection line is also greater than a length of a connection line between the second end and the fourth end; the third side connects the first end to the third end, the fourth side connects the second end to the fourth end, a connection line between a midpoint of the third side and a midpoint of the fourth side is a second connection line, and a length of the second connection line is less than a length of a connection line between the first end and the second end, the length of the second connection line is also smaller than a length of a connection line between the third end and the fourth end, and the second connection line passes through a midpoint of the first connection line; and the target shape of the mesh region is a rectangle shape.

For example, in the mask provided by at least one embodiment of the present disclosure, the mesh region comprises a plurality of first sub-openings, and in a case where the mesh region is in the target shape, the plurality of first sub-openings are arranged in a regular array.

For example, the mask provided by at least one embodiment of the present disclosure further comprises: a first dummy mesh region and a second dummy mesh region, the first dummy mesh region is between the first clamping region and the mesh region, and the second dummy mesh region is between the second clamping region and the mesh region.

At least one embodiment of the present disclosure provides a manufacturing method for a mask, and the manufacturing method comprises: providing a test mask, the test mask comprising a first clamping region and a second clamping region, which are opposite to each other in a first direction, and further comprising at least one mesh region between the first clamping region and the second clamping region, the at least one mesh region having a target shape; acquiring deformation state information of the mesh region in a case where the test mask is stretched along the first direction; acquiring reverse compensation information for the mesh region according to the deformation state information, and obtaining target initial state information of the mesh region based on the reverse compensation information, and manufacturing a mask according to the target initial state information, and at least one mesh region of the mask manufactured being in a first shape.

For example, in the manufacturing method provided by at least one embodiment of the present disclosure, the deformation state information is obtained through a simulation method.

For example, in the manufacturing method provided by at least one embodiment of the present disclosure, the deformation state information comprises deformation modes and/or deformation amounts of the mesh region at a plurality of positions.

For example, the manufacturing method provided by at least one embodiment of the present disclosure further comprises: fitting deformation curves of the mesh region in the first direction and in a second direction according to the deformation state information, the second direction is substantially perpendicular to the first direction.

For example, in the manufacturing method provided by at least one embodiment of the present disclosure, acquiring the reverse compensation information for the mesh region comprises: obtaining the reverse compensation information according to the deformation curves.

For example, in the manufacturing method provided by at least one embodiment of the present disclosure, the reverse compensation information comprises deformation compensation values of the mesh region at the plurality of positions or deformation compensation curves of the mesh region in the first direction and in the second direction.

For example, in the manufacturing method provided by at least one embodiment of the present disclosure, the mesh region comprises a plurality of first sub-openings arranged in an array, and the manufacturing method further comprises: acquiring reverse compensation information of each of the plurality of first sub-openings according to the reverse compensation information for the mesh region.

For example, in the manufacturing method provided by at least one embodiment of the present disclosure, the mesh region comprises a plurality of first sub-openings arranged in an array, the plurality of first sub-openings are divided into M×N regions, each region of the M×N regions comprises at least one first sub-opening, and M and N are positive integers greater than or equal to 2, the manufacturing method further comprises: according to the reverse compensation information for the mesh region, obtaining reverse compensation information of the first sub-opening in each region.

For example, in the manufacturing method provided by at least one embodiment of the present disclosure, the test mask is stretched in the first direction through the first clamping region and the second clamping region.

For example, in the manufacturing method provided by at least one embodiment of the present disclosure, the target initial state information of the mesh region comprises target initial shape information and target initial dimension information of the mesh region.

For example, the manufacturing method provided by at least one embodiment of the present disclosure further comprises: recording the target initial state information of the mesh region in a form of a table or a graph.

For example, in the manufacturing method provided by at east one embodiment of the present disclosure, the mesh region comprises a plurality of first sub-openings arranged in are array, and recording the target initial state information of the mesh region in the form of a table comprises: establishing a rectangular coordinate system, and recording coordinates and dimensions of the plurality of first sub-openings in the rectangular coordinate system in a table.

For example, in the manufacturing method provided by at least one embodiment of the present disclosure, the mesh region comprises a plurality of first sub-openings arranged in an array, the plurality of first sub-openings are divided into M×N regions, each region of the M×N regions comprises at least one first sub-opening, and M and N are positive integers greater than or equal to 2, recording the target fate information of the mesh region in the form of a table comprises: establishing a rectangular coordinate system, and recording a coordinate and a dimension of the first sub-opening of each region in the rectangular coordinate system in a table.

For example, in the manufacturing method provided by at least one embodiment of the present disclosure, recording the target initial state information of the mesh region in the form of a graphic comprises: drawing a curve of a deformation amount of the mask relative to the test mask.

At least one embodiment of the present disclosure also provides a manufacturing method for a display substrate. The manufacturing method includes: manufacturing a mask device using the mask according to any one of the above embodiments, and using the mask device to form at least one functional layer of the display substrate.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIGS. 3A-3D are schematic diagrams of a mask device in a manufacturing process;

FIG. 4B is a schematic diagram of a deformation trend of a plurality of sub-openings in a mesh region of the mask shown in FIG. 1A after being stretched;

FIG. 5A is a flowchart of a manufacturing method for a mask provided by at least one embodiment of the present disclosure;

FIG. 6A is a deformation simulation test diagram of a test mask in a first direction provided by at least one embodiment of the present disclosure;

FIG. 6B is a deformation simulation curve of a test mask in a first direction provided by at least one embodiment of the disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A mask device, such as a fine metal mask (FMM), usually includes a mask and a mask frame, the mask is tensioned and fixed to the mask frame by both ends of the mask. A material of the mask is usually a metal, such as a metal with high thermal stability and low thermal expansion coefficient, such as Invar alloy, stainless steel, etc.

Figure 1A:
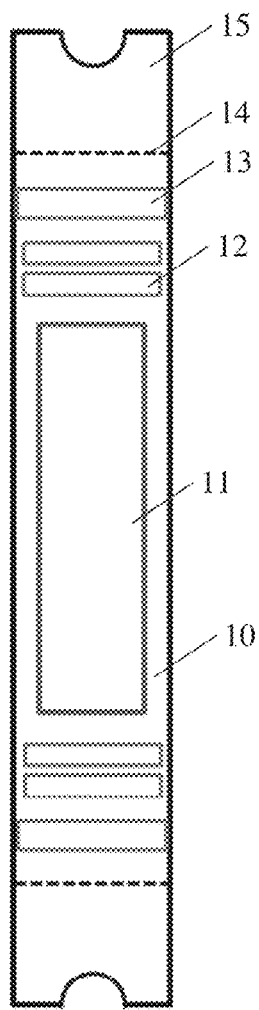
FIG. 1A is a schematic diagram of a mask.

For example, FIG. 1A shows a schematic structural diagram of a mask, the mask can be used to manufacture a display substrate of an organic light emitting display device, for example. As shown in FIG. 1A, the mask is in a long strip shape, and includes a display opening region 11, dummy opening regions 12, welding regions 13, cutting regions 14, and clamping regions 15 formed on a substrate 10 and arranged in a length direction of the mask.

Figure 2:
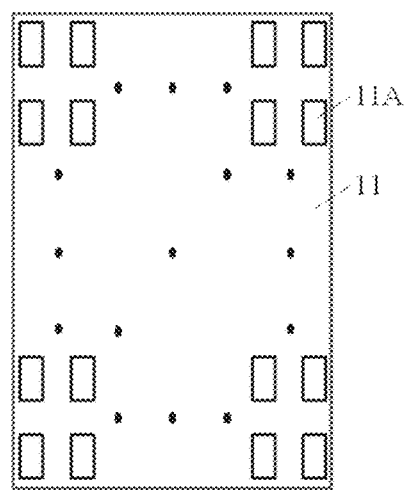
FIG. 2 is a schematic diagram of a mesh region of the mask shown in FIG. 1A.

For example, the display opening region 11 may include a plurality of sub-openings respectively corresponding to a plurality of pixel units of a display substrate, and in this case, the plurality of sub-openings are evenly distributed in the display opening region 11. For example, FIG. 2 shows a situation regarding the above-mentioned display opening region 11. As shown in FIG. 2, the display opening region 11 includes a plurality of sub-openings 11A, and the plurality of sub-openings 11A are evenly distributed in the display opening region 11. Or, in some examples, the display opening region 11 may include a plurality of sub-openings respectively corresponding to a plurality of pixel units of a plurality of display substrates, in this case, the plurality of sub-openings are distributed in groups in the display opening region 11, each group corresponds to a partial region of a display substrate, and in each group, the plurality of sub-openings are evenly distributed. The display opening region 11 is a main functional region for manufacturing a display substrate (display region) using the mask. Therefore, in the design and manufacturing process of the mask, the display opening region 11 is a main research object. For example, each of the dummy opening regions 12 is located at an end of the display opening region 11, so as to eliminate the unevenness that may occur at the position of the end and disperse the stress on the display opening region 11 during, for example, a stretching process, but the dummy opening regions 12 are not used to manufacture a pixel structure for display of the display substrate.

Hereinafter, a case where the display opening region 1 includes a plurality of sub-openings corresponding to a plurality of pixel units of a display substrate is taken as an example for illustration, but this does not constitute a limitation on the present disclosure.

For example, FIGS. 3A-3D illustrate a manufacturing process of a mask device, and the mask device includes one or more masks as shown in FIG. 1A. As shown in FIG. 3A, first, a mask frame 20 is provided, and the mask frame 20 is in a rectangular shape as a whole. The mask frame 20 is fixed, and then, as shown in FIG. 3B, for example, a manipulator is used to stretch the mask through the clamping regions 15 along a side parallel to the mask frame 20 (that is, in a length direction of the mask, a vertical direction in the figure), and the plurality of sub-openings 11A located in the display opening region 11 are at target positions by adjusting the magnitude of the pulling force, and in this case, the welding regions 13 at both ends of the mask correspond to the two sides of the mask frame 20. As shown in FIG. 3C, in a case where the plurality of sub-openings 1 in the display opening region 11 are at the target positions, for example, the welding regions 13 of the mask are welded to the mask frame 20 by a laser welding method, thereby fixing the mask to the mask frame 20. As shown in FIG. 3D, after the welding process is completed, a cutting process is performed along the cutting regions 14 to remove the clamping regions 15 to form the mask device.

Figure 4A:
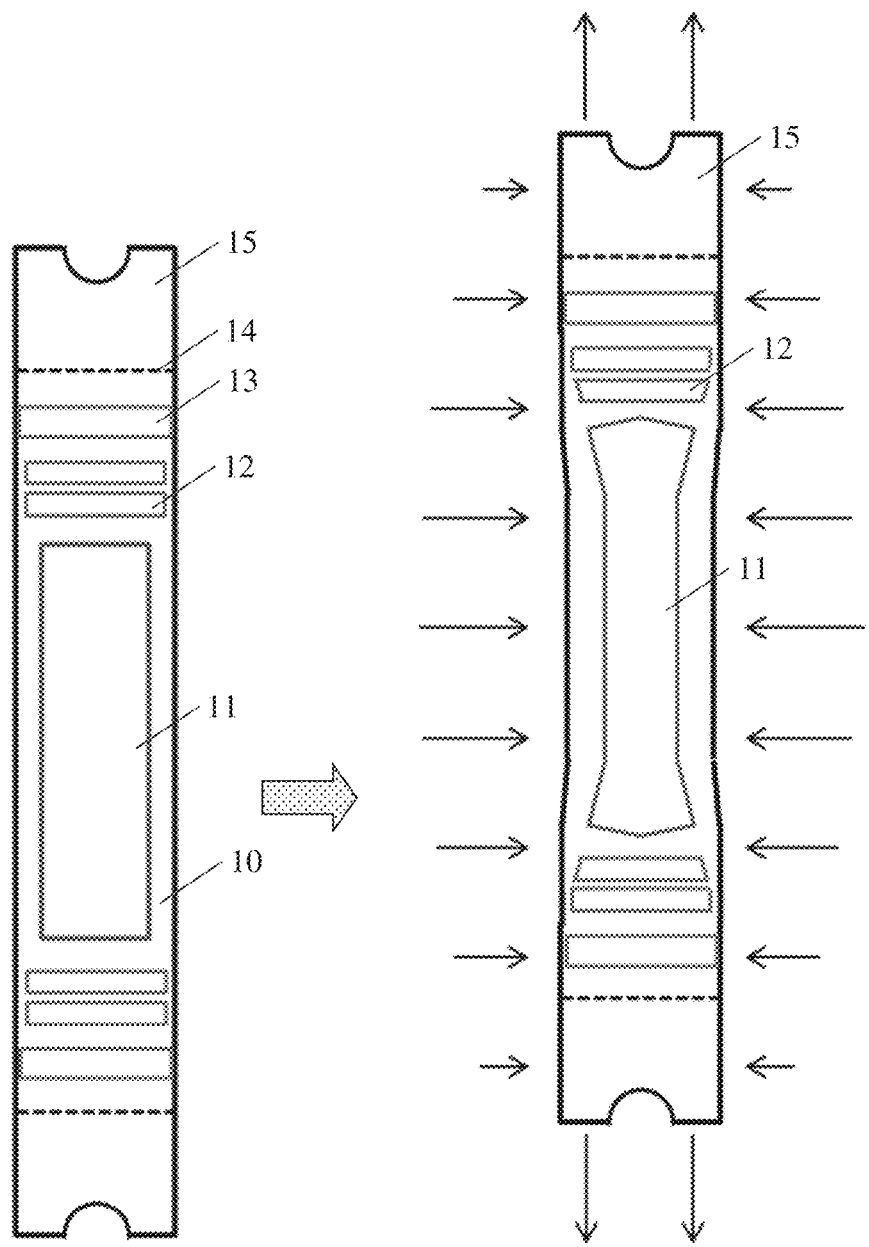
FIG. 4A is a schematic diagram of a deformation trend of a mesh region of the mask shown in FIG. 1A after being stretched.

However, in fact, the mask shown in FIG. 1A cannot maintain the shape and dimension before being stretched during a stretching process. The length of the mask along a stretching direction will become longer and the width of the mask will become narrower. Therefore, compared to the shape and dimension of the mask before being stretched, the shape and dimension of the mask after being stretched will change, and for example, have a change trend as shown in FIG. 4A, the left side of the figure is a schematic diagram of the mask without deformation before being stretched, and the right side of the figure is a schematic diagram of the mask with deformation after being stretched. In this case, the shapes and dimensions of the plurality of sub-openings 11A located in the display opening region 11 of the mask may also change accordingly, and for example, have a change trend as shown in FIG. 4B, the left side of the figure is a schematic diagram of the mask without deformation before being stretched, and the right side of the figure is a schematic diagram of the mask with deformation after being stretched. In order to make the shapes and dimensions of the plurality of sub-openings 11A in the opening region 11 of the mask achieve the target state after the mask is stretched, the dimension of the mask before being stretched can be compensated, thereby obtaining the compensated mask.

Figure 1B:
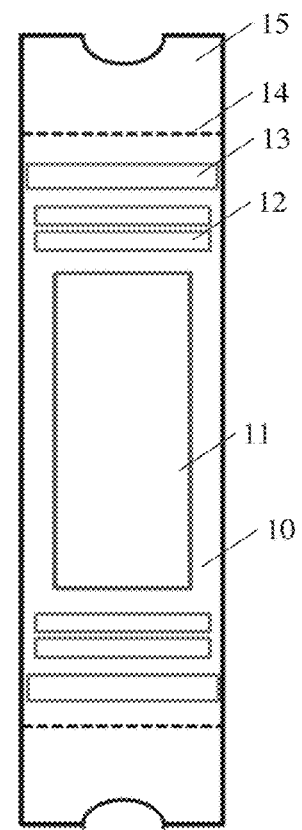
FIG. 1B is a schematic diagram showing a dimension compensation design of the mask shown in FIG. 1A.

For example, FIG. 1B shows a new mask obtained after performing dimension compensation on the mask shown in FIG. 1A, the compensated mask is designed so that after the compensated mask is stretched and fixed to the mask frame 20, the compensated mask is expected to have the same shape and dimension as the mask shown in FIG. 1A. The operation of performing dimension compensation may include shortening the length of the mask in the stretching direction and widening the width of the mask. In this case, the dimensions of the plurality of sub-openings 11A in the display opening region 11 are also adjusted accordingly, so that after the mask is stretched, the shapes and dimensions of the plurality of sub-openings 11A in the display opening region 11 are closer to the target state.

However, because the mask includes a plurality of regions, such as the display opening region 11, the dummy opening regions 12, the welding regions 13, the cutting regions 14, and the clamping regions 15, etc., these regions have different structures, and thus have different physical properties. For example, the Young's moduli, shear moduli, Poisson's ratios, and the like of these regions are different in respective directions. In a case where a pulling force is applied to the mask through the clamping regions 15 of the mask and the pulling force is transmitted to the display opening region 11 through the various regions from the clamping regions, the display opening region 11 receives different stresses at different positions, resulting in different deformation amounts of the display opening region 11 at different positions. Correspondingly, the positions of the plurality of sub-openings 11A in the display opening region 11 will also be shifted, and the shift amounts of the sub-openings 11A at different positions are also different. In this case, the manufacturing accuracy requirement of the mask cannot be achieved through the dimension compensation as shown in FIG. 1B. For example, during the manufacturing process of the mask, in a case where the mask is stretched, the positions of the plurality of sub-openings 11A in the display opening region 11 may not be able to reach the target positions by adjusting the pulling force, so that the adjusting process is prolonged, and even the manufacturing process is stalled, which affects production efficiency and product yield. Moreover, even if the artificial control makes the manufacturing process continue, the mask device finally obtained cannot meet the accuracy requirement. Therefore, in a case where the method is used to manufacture a display substrate, the manufacturing accuracy requirement of the display substrate cannot be achieved. For example, the organic light emitting material cannot be formed at the target position through the mask, thereby causing defects such as dark spots and cross-colors on the display substrate.

At least one embodiment of the present disclosure provides a mask, a manufacturing method therefor, a manufacturing method for a mask device, and a manufacturing method for a display substrate. The mask includes: a first clamping region and a second clamping region, which are opposite to each other in a first direction, and at least one mesh region between the first clamping region and the second clamping region. The mesh region is in a first shape. In a case where the mask is stretched in the first direction, the mesh region is in a target shape, and the target shape is different from the first shape. The target shape; includes a polygon shape, a circle shape, or an ellipse shape.

The manufacturing method for the mask includes: providing a test mask, the test mask including a first clamping region and a second clamping region, which are opposite to each other in a first direction, and at least one mesh region between the first clamping region and the second clamping region, and the at least one mesh region being in a target shape; acquiring deformation state information of the mesh region case where the test mask is stretched along the first direction, acquiring reverse compensation information for the mesh region according to the deformation state information, and obtaining target initial state information of the mesh region based on the reverse compensation information, and manufacturing a mask according to the target initial state information, and the at least one mesh region of the mask manufactured being in a first shape.

The mask manufactured by the above manufacturing method for the mask can have a mesh region in a target shape after the mask is stretched and fixed to a mask flame, and a plurality of openings in the mesh region are at target positions and have target shapes and target dimensions, so that the mask device formed with the mask has high precision. In a case where the mask device is used for manufacturing a display substrate, the manufactured display substrate has higher accuracy, so that it is possible to avoid defects such as dark spots and cross-colors on the display substrate.

Hereinafter, the mask, the manufacturing method therefor, the manufacturing method for the mask device, and the manufacturing method for the display substrate provided by the embodiments of the present disclosure are described in detail through several specific embodiments.

At least one embodiment of the present disclosure provides a manufacturing method for a mask, and FIG. 5A shows a flowchart of the manufacturing method. As shown in FIG. 5A, the manufacturing method includes steps S101~S104.

Step S101: providing a test mask, the test mask comprising a first clamping region and a second clamping region, which are opposite to each other in a first direction, and further comprising at least one mesh region between the first clamping region and the second clamping region.

Figure 5B:
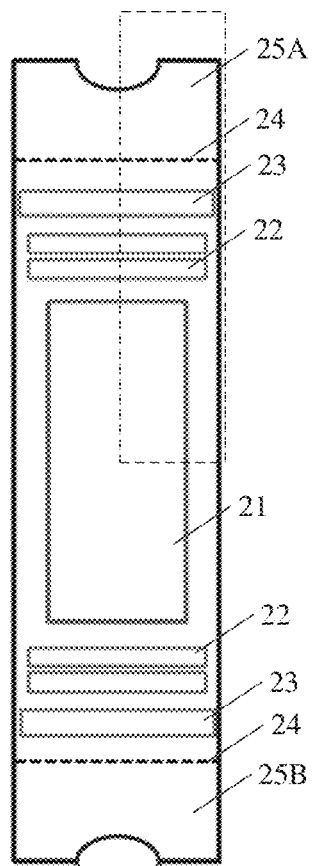
FIG. 5B is a schematic diagram of a test mask provided by at least one embodiment of the present disclosure.
Figure 5C:
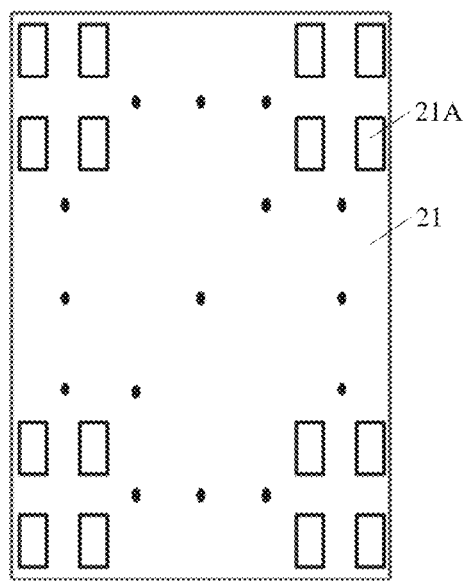
FIG. 5C is a schematic diagram of a mesh region of a test mask provided by at least one embodiment of the present disclosure.

For example, FIG. 5B shows a schematic diagram of a test mask. As shown in FIG. 5B, the test mask includes a first clamping region 25A and a second clamping region 25B, which are opposite to each other in a first direction (shown as a vertical direction in the figure), and at least one mesh region 21 (shown as one mesh region 21 in the figure) between the first clamping region 25A and the second clamping region 25B, For example, the at least one mesh region is in a target shape, and the target shape may include, for example, a polygon shape, a circle shape, an ellipse shape, or the like. As shown in FIG. 5C, the mesh region 21 includes a plurality of first sub-openings 21A arranged in an array. In the process of stretching the test mask, the test mask can be stretched by a manipulator clamping the first clamping region 25A and the second clamping region 25B and applying a pulling force.

For example, the test mask has a shape that is the same as a shape of a target mask to be designed, and includes various regions of the target mask to be designed, for example, in addition to the above-mentioned regions, some other regions may be included, such as dummy mesh regions 22, welding regions 23, and cutting regions 24, etc. The embodiments of the present disclosure are not limited in this aspect.

It should be noted that, in other embodiments, the test mask may also have a plurality of mesh regions for manufacturing a plurality of display substrates. The embodiments of the present disclosure do not limit the number of mesh regions.

Step S102: acquiring deformation state information of the mesh region in a case where the test mask is stretched along the first direction.

For example, the first clamping region 25A and the second clamping region 25B are clamped by a manipulator and a pulling force is applied to the test mask along the length direction of the test mask, thereby stretching the test mask. In this case, the test mask is deformed because of the force, and for example, has a deformation trend as shown in FIG. 4A, and the mesh region 21 is also deformed accordingly, and for example, has a deformation trend as shown in FIG. 4B. For example, the stretched state in the first direction is a stretched state of the mask in a case where the mask is stretched and fixed to the mask frame to form a mask device.

For example, the test mask can be provided and stretched by a simulation method or an actual operation, and the deformation state information of the mesh region can be obtained by a simulation method or an actual measurement method. The simulation method can be performed by a computer. For example, the simulation process includes providing a dummy test mask, and then performing a dummy stretching operation on the dummy test mask to obtain the deformation state information and the like of the test mask. This method is simple and fast, and the required data can be obtained in short time. The actual measurement process includes providing a real test mask, and then performing a stretching operation on the test mask, so as to obtain the deformation state information and the like of the test mask through actual measurement.

For example, the deformation state information includes the deformation modes and/or deformation amounts of the mesh region at a plurality of positions. For example, the deformation state information includes the deformation modes (for example, being stretched or compressed) of an outer contour of the mesh region at the plurality of positions and the deformation amounts (for example, the stretching amount or the compression amount) in the deformation modes, so that the deformation state of the mesh region, such as deformation shape and deformation dimension, can be obtained.

For example, in a case where the deformation state information of the mesh region is obtained by a simulation method, because of the symmetry of the test mask, ¼ part of the test mask can be taken as a target for deformation research, and the deformation state of the remaining parts of the test mask can be obtained by simple symmetric transformation (including axisymmetric transformation and central symmetric transformation) according to the ¼ part. For example, the ¼ part is a part circled by a dotted frame in FIG. 5B, and is hereinafter referred to as a test part. The deformation research includes research on the deformation mode and the deformation amount of the test part in different directions.

Figure 6C:
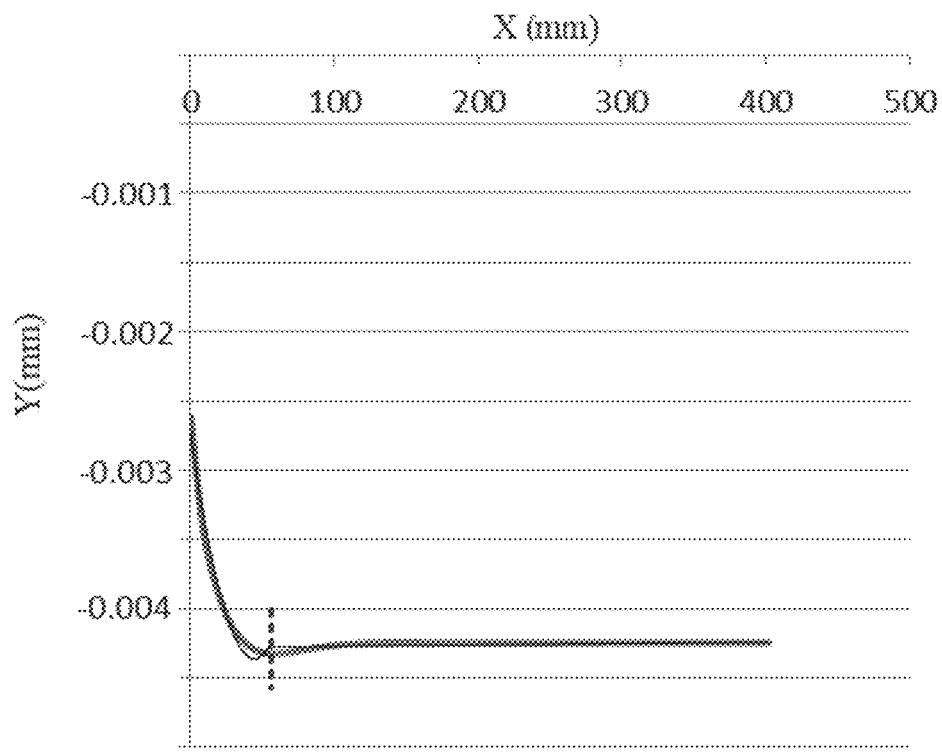
FIG. 6C is a deformation fitting curve of a test mask in a first direction provided by at least one embodiment of the present disclosure.
Figure 7A:
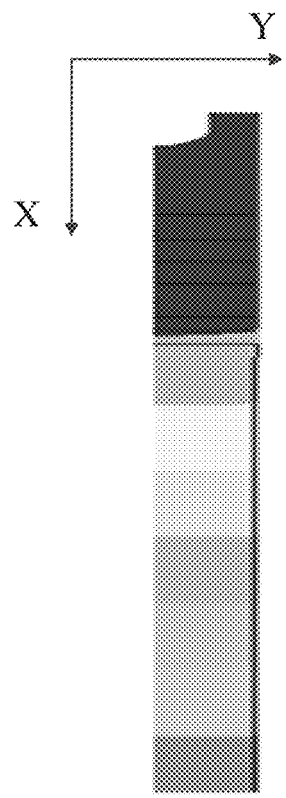
FIG. 7A is a deformation simulation test diagram of a test mask in a second direction provided by at least one embodiment of the present disclosure.

For example, in one example, FIG. 6A shows a deformation simulation test diagram of the test part of the test mask in the first direction, and FIG. 7A shows a deformation simulation test diagram of the test part of the test mask in the second direction. Different colors in the deformation simulation test diagram indicate different deformation modes and deformation amounts, so that the deformation states of the mesh region at the plurality of positions can be obtained from the diagram.

For example, in some embodiments, the manufacturing method further includes: fitting deformation curves of the mesh region in the first direction and in the second direction according to the above deformation state information, in which the second direction is perpendicular to the first direction. For example, in a case where the first direction is the vertical direction (length direction) shown in FIG. 5B, the second direction is the horizontal direction (width direction) the figure.

For example, FIG. 6B is a deformation simulation curve in the first direction of the test part of the test mask obtained according to FIG. 6A, FIG. 6C is a deformation fitting curve in the first direction of the test part of the test mask obtained according to FIG. 6B, the X axis and the Y axis in FIG. 6B correspond to the X axis and the Y axis in FIG. 6A, respectively, and y represents the positions of the edge of the mesh region after deformation at different x. The above-mentioned deformation simulation curve is also shown in FIG. 6C, so there are two curves in FIG. 6C. It can be seen from FIG. 6C that the deformation simulation curve and the deformation fitting curve substantially coincide. For example, the deformation fitting curve can be divided into two parts, which are separated by a dotted line in the figure, and the curve fitting formula of the left part is:

$$f(y)=8\times10^{-7}y^2-7\times10^{-5}y-0.0027, (0\leq y\leq 56).$$

The curve fitting formula of the right part is:

$$f(y)=9\times10^{-08}y-0.0043, (y>56).$$

Therefore, the deformation states of the test mask at the plurality of positions along the first direction can be obtained by these formulas.

Figure 6D:
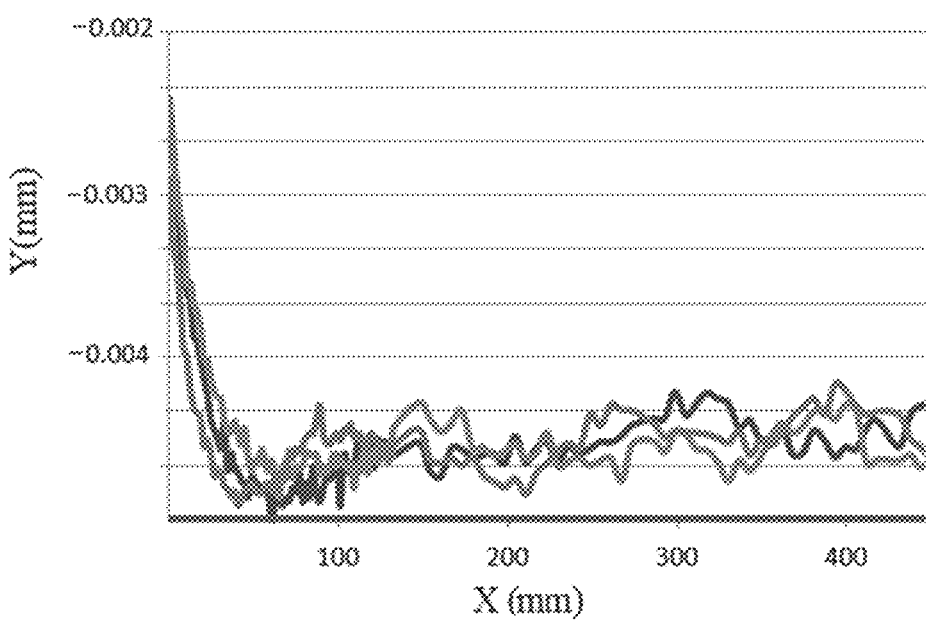
FIG. 6D is a deformation measurement curve of a test mask in a first direction provided by at least one embodiment of the present disclosure.

For example, FIG. 6D is a deformation measurement curve of the test part of the test mask in the first direction, and the deformation measurement curve is obtained by stretching a real test mask and measuring the deformation state of the stretched test mask. Three deformation measurement curves are shown in FIG. 6D, and the three deformation measurement curves are respectively obtained through three deformation tests. It can be seen by comparison that the deformation simulation curve and the deformation measurement curve are substantially the same, and therefore the test mask can be detected by a simulation method to avoid the complicated actual operation process.

Figure 7B:
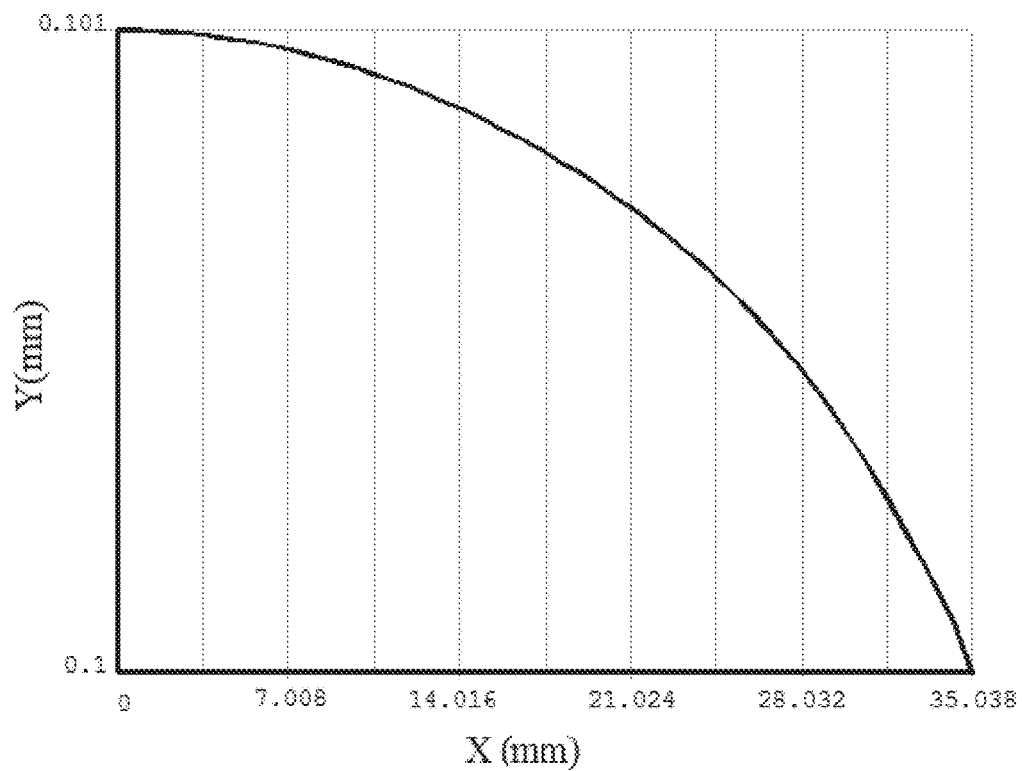
FIG. 7B is a deformation simulation curve of a test mask in a second direction provided by at least one embodiment of the disclosure.
Figure 7C:
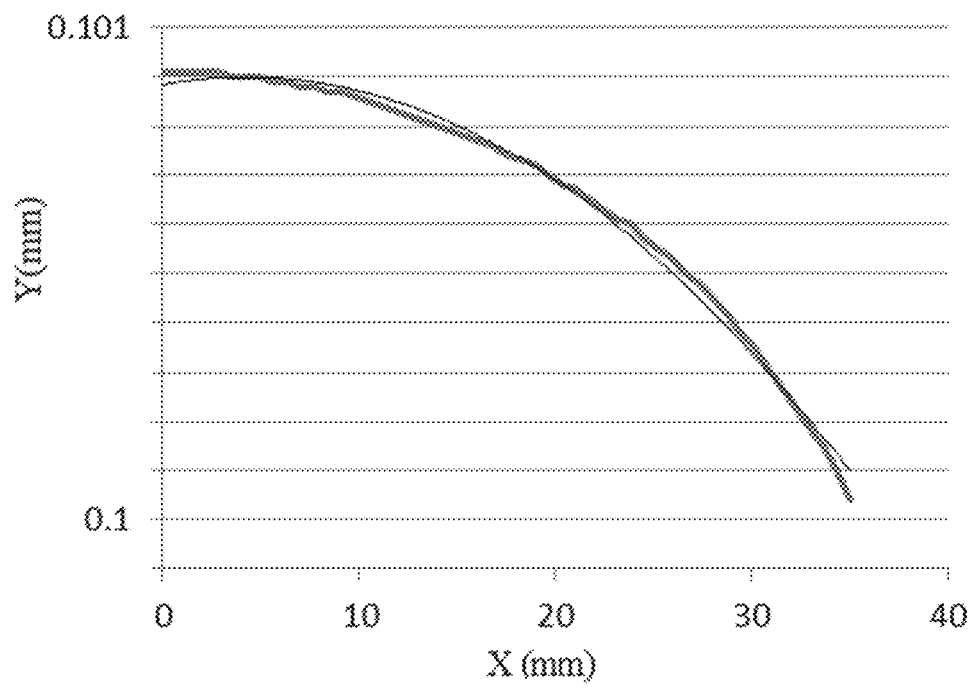
FIG. 7C is a deformation fitting curve of a test mask in a second direction provided by at least one embodiment of the present disclosure.

For example, FIG. 7B is a deformation simulation curve in the second direction of the test part of the test mask obtained according to FIG. 7A, FIG. 7C is a deformation fitting curve in the second direction of the test part of the test mask obtained according to FIG. 7B, the X axis and the Y axis in FIG. 7B correspond to the X axis and the Y axis in FIG. 7A, respectively, and y represents the positions of the edge of the mesh region after deformation at different x. The above-mentioned deformation simulation curve is also shown in FIG. 7C, so there are two curves in FIG. 7C. It can be seen from FIG. 7C that the deformation simulation curve and the deformation fitting curve substantially coincide. The fitting formula of the fitting curve is:

$$f(x)=-8\times10^{-7}x^2+7\times10^{-6}x+0.1009.$$

Therefore, the deformation states of the test mask at the plurality of positions along the second direction can be obtained by this formula.

Figure 7D:
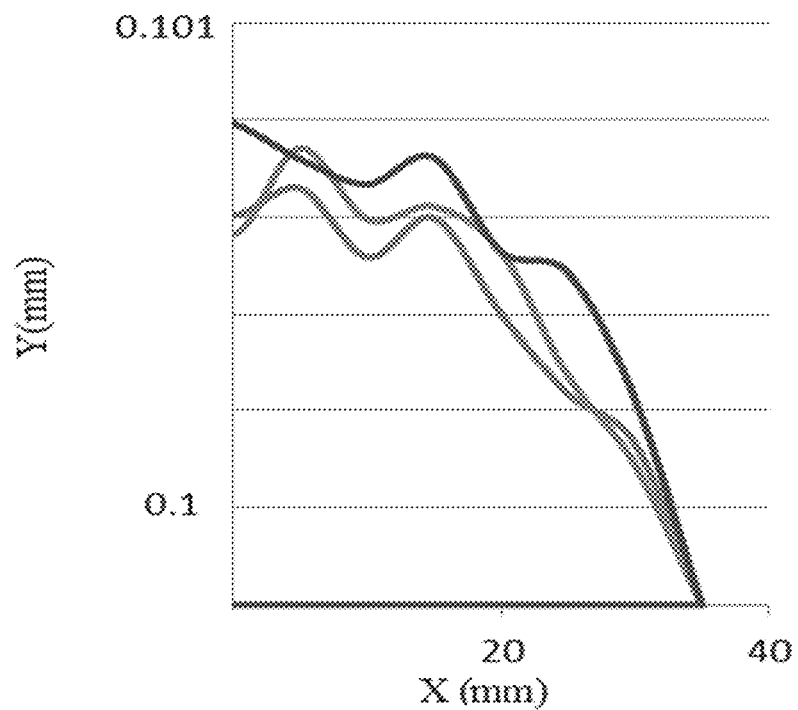
FIG. 7D is a deformation measurement curve of a test mask in a second direction provided by at least one embodiment of the present disclosure.

For example, FIG. 7D is a deformation measurement curve of the test part of the test mask in the second direction, and three deformation measurement curves are shown in FIG. 7D, and the three deformation measurement curves are respectively obtained through three deformation tests. It can be seen by comparison that the deformation simulation curve and the deformation measurement curve are substantially the same.

Step S103: acquiring reverse compensation information for the mesh region according to the deformation state information, and obtaining target initial state information of the mesh region based on the reverse compensation information.

For example, after the deformation state information, such as the deformation curves, is obtained according to the above method, the reverse compensation information for the mesh region can be obtained according to the deformation curves. For example, the reverse compensation information includes deformation compensation values of the mesh region at the plurality of positions or deformation compensation curves of the mesh region in the first direction and in the second direction.

For example, setting an extending value of the mesh region in a certain direction because of stretching to a positive value (+), and setting a shortened value of the mesh region in a certain direction because of compression to a negative value (−), in this case, in a case where the deformation amount of the mesh region of the test mask at a certain position is +A (A is any positive number), the deformation compensation value of the mesh region at this certain position is −A; in a case where the deformation amount of the mesh region of the test mask at a certain position is −B (B is any positive number), the deformation compensation value of the mesh region at this certain position is +B. Thus, the deformation compensation values of the mesh region at various positions can be obtained. For example, the deformation compensation curve of the mesh region can be obtained by fitting the above-mentioned deformation compensation values to the curve, alternatively, the deformation compensation curve of the mesh region can also be obtained by symmetrically processing the deformation curve. Finally, the above-mentioned deformation compensation value or deformation compensation curve is superimposed on the initial state (for example, initial dimension information) of the test mask, so that the target initial state information of the mesh region can be obtained.

Figure 8A:
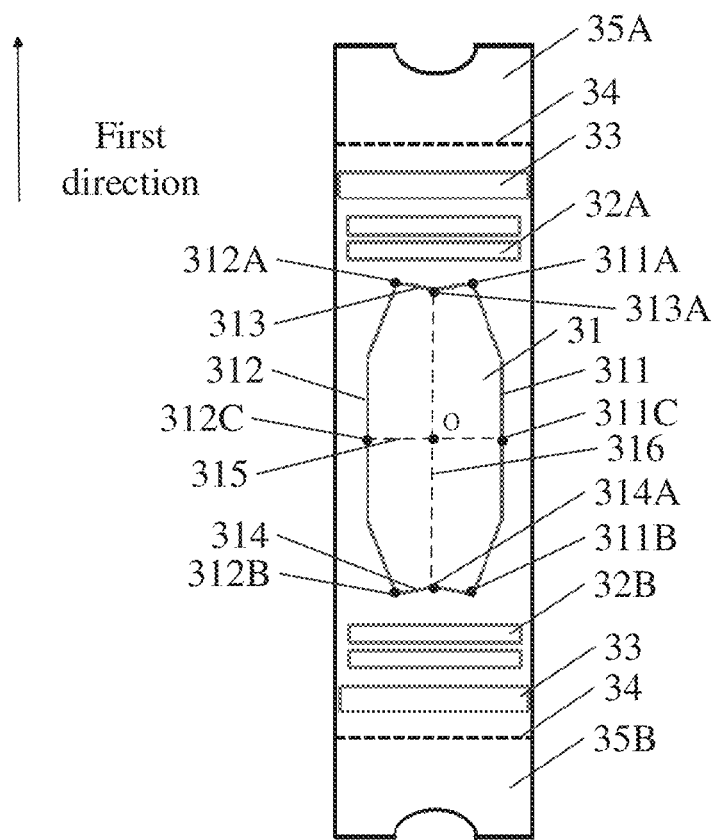
FIG. 8A is a schematic diagram of a mask provided by at least one embodiment of the present disclosure.

For example, the target initial state information of the mesh region finally obtained based on the above-mentioned reverse compensation information includes target initial shape information and target initial dimension information of the mesh region. For example, FIG. 8A shows a mask (the mask in an unstretched state) designed according to the target initial state information of the test mask obtained according to the reverse compensation information, after the mask is tensioned and fixed to the mask frame, a desired regular mesh region (or display opening region) can be obtained. It can be seen that the mask in the unstretched state has a substantially opposite deformation state compared to the mask shown in FIG. 3 obtained by stretching and deforming the initial mask of FIG. 1B. Because the mesh region of the mask is reversely compensated, the mesh region may be in a target shape after being stretched, for example, the target shape corresponds to a shape of a display region of the display substrate to be manufactured. For example, the target shape is a regular rectangle shape or the like.

For example, as shown in FIG. 5C, the mesh region 21 includes a plurality of first sub-openings 21A arranged in an array. In this case, the manufacturing method for the mask further includes: acquiring the reverse compensation information of each of the plurality of first sub-openings according to the reverse compensation information for the mesh region.

Figure 8B:
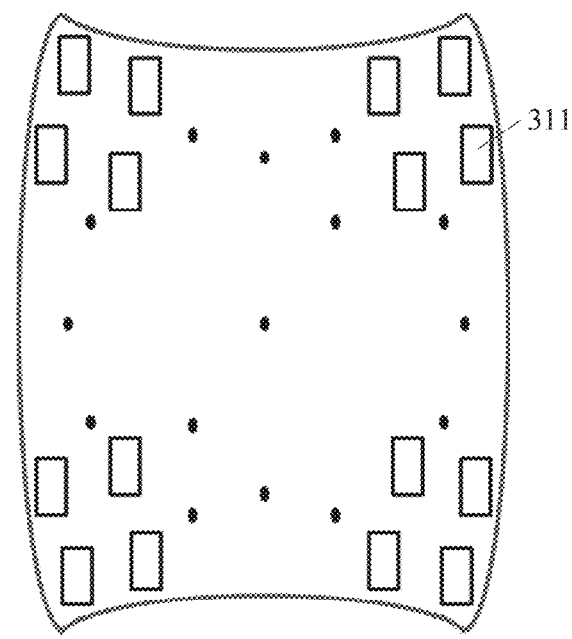
FIG. 8B is a schematic diagram of a mesh region of a mask provided by at least one embodiment of the present disclosure.

For example, in a case where the reverse compensation information of the mesh region is determined, according to the reverse compensation information of the mesh region, for example, according to the reverse compensation information of the mesh region at each position, each first sub-opening 21A at a corresponding position in the mesh region 21 can be compensated in proportion, so as to obtain the reverse compensation information of each first sub-opening 21A. The reverse compensation information includes, for example, the positional offset compensation amounts of the first sub-openings 21A at respective positions of the mesh region. For example, the positional offset compensation amounts of the first sub-openings 21A at respective positions are different, and the closer the first sub-opening 21A is to the edge of the mesh region, the greater the positional offset compensation amount of the first sub-opening 21A is. For example, the arrangement mode of the plurality of first sub-openings 21A of the mesh region 21 obtained according to the above method is shown in FIG. 8B. After the mask is stretched, the plurality of sub-openings 21A of the mesh region 21 may have target shapes and have a target arrangement mode, for example, each first sub-opening 21A is formed to be in a rectangular shape, and all first sub-openings 21A in the mesh region are arranged in a regular array, such as in the arrangement mode shown in FIG. 5C.

For example, in some embodiments, in a case where the number of first sub-openings in the mesh region is large, the plurality of first sub-openings in the mesh region may be divided into a plurality of regions, because the positions of the plurality of first sub-openings in each region are close, the deformation modes and the deformation amounts of the plurality of first sub-openings in each region are also similar, so that the plurality of first sub-openings can be compensated according to the region. In this case, the same compensation is performed on the plurality of first sub-openings in the same region, so that the data processing amount in the design process can be reduced.

For example, the mesh region includes a plurality of first sub-openings arranged in an array, the plurality of first sub-openings is divided into M×N regions (M and N are positive integers greater than or equal to 2), and each region includes at least one first sub-opening, for example, includes 2, 4, 6, or 8 first sub-openings. In this case, the manufacturing method for the mask further includes: according to the reverse compensation information for the mesh region, obtaining reverse compensation information of the first sub-opening in each region. For example, in a case where each region includes 2 first sub-openings, the compensation data processing amounts for the plurality of first sub-openings can be reduced by half; in a case where each region includes 4 first sub-openings, the compensation data processing amounts for the plurality of first sub-openings can be reduced to ¼ of the original compensation data processing amounts, so that the compensation according to the region can reduce the workload and improve work efficiency.

For example, in some embodiments, after the target initial state information of the mesh region is obtained, the manufacturing method for the mask further includes: recording the target initial state information of the mesh region in a form of a table or a graph.

For example, in some examples, the mesh region includes a plurality of first sub-openings arranged in an array, and recording the target initial state information of the mesh region in the form of a table includes: establishing a rectangular coordinate system, and recording coordinates and dimensions of the plurality of first sub-openings in the rectangular coordinate system in a table.

Figure 9A:
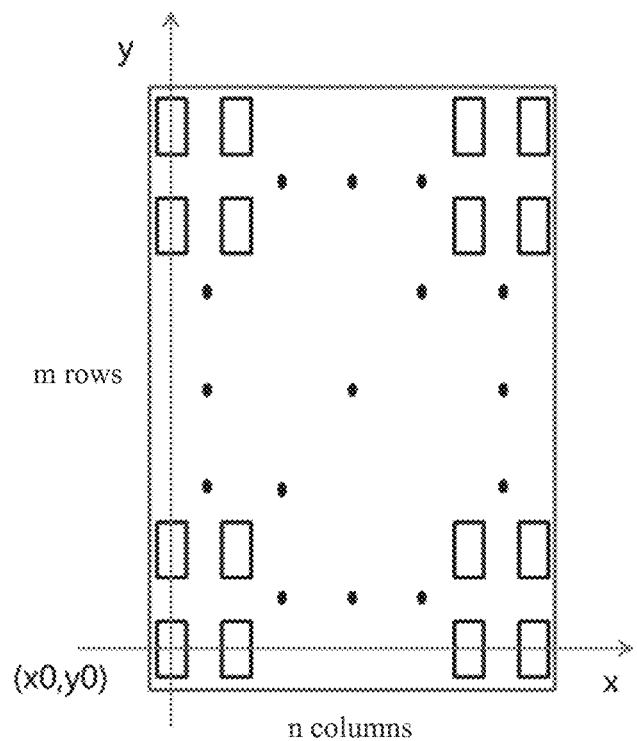
FIG. 9A is a schematic diagram of a mesh region of a mask in a rectangular coordinate system provided by at least one embodiment of the present disclosure.

For example, FIG. 9A shows the target initial state of the mesh region. As shown in FIG. 9A, a center of a first sub-opening in the lower left corner of the mesh region can be used as the origin (x0, y0) of the rectangular coordinate system, and the coordinates and dimensions of the first sub-openings in m rows and n columns in the rectangular coordinate system can be recorded in the table. As shown in Table 1, the coordinates for recording position information of each first sub-opening include a x coordinate and a y coordinate, and the dimension information includes a dimension w along the x direction and a dimension h along the y direction. For example, the coordinates (x, y) of each first sub-opening represent a position of a vertex or a center of the first sub-opening in the rectangular coordinate system, the dimension w along the x-direction and the dimension h along the y direction represent a distance of the first sub-opening extending in the x direction and a distance of the first sub-opening extending in the y-direction, respectively, so that the position, shape, and dimension information of each first sub-opening can be obtained.

TABLE 1

| Row | | Column | | | | | | |
|---|---|---|---|---|---|---|---|---|
| | | 1 | | 2 | | ... | n | |
| | | coordinate | dimension | coordinate | dimension | ... | coordinate | dimension |
| m | x direction | $x_{1m}$ | $w_{1m}$ | $x_{2m}$ | $w_{2m}$ | ... | $x_{nm}$ | $w_{nm}$ |
| | y direction | $y_{1m}$ | $h_{1m}$ | $y_{2m}$ | $h_{2m}$ | ... | $y_{nm}$ | $h_{nm}$ |
| ... | | ... | | ... | | ... | | |
| 2 | x direction | $x_{12}$ | $w_{12}$ | $x_{22}$ | $w_{22}$ | ... | $x_{n2}$ | $w_{n2}$ |
| | y direction | $y_{12}$ | $h_{12}$ | $y_{22}$ | $h_{22}$ | ... | $y_{n2}$ | $h_{n2}$ |
| 1 | x direction | $x_{11}$ | $w_{11}$ | $x_{21}$ | $w_{21}$ | ... | $x_{n1}$ | $w_{n1}$ |
| | y direction | $y_{11}$ | $h_{11}$ | $y_{21}$ | $h_{21}$ | ... | $y_{n1}$ | $h_{n1}$ |

For example, in some examples, the mesh region includes a plurality of first sub-openings arranged in an array, and the plurality of first sub-openings are divided into M×N regions (M and N are positive integers greater than or equal to 2), each region includes at least one first sub-opening; in this case, recording the target initial state information of the mesh region in the form of a table comprises: establishing a rectangular coordinate system, and recording the coordinate and dimension of the first sub-opening of each region in the rectangular coordinate system in a table.

Figure 9B:
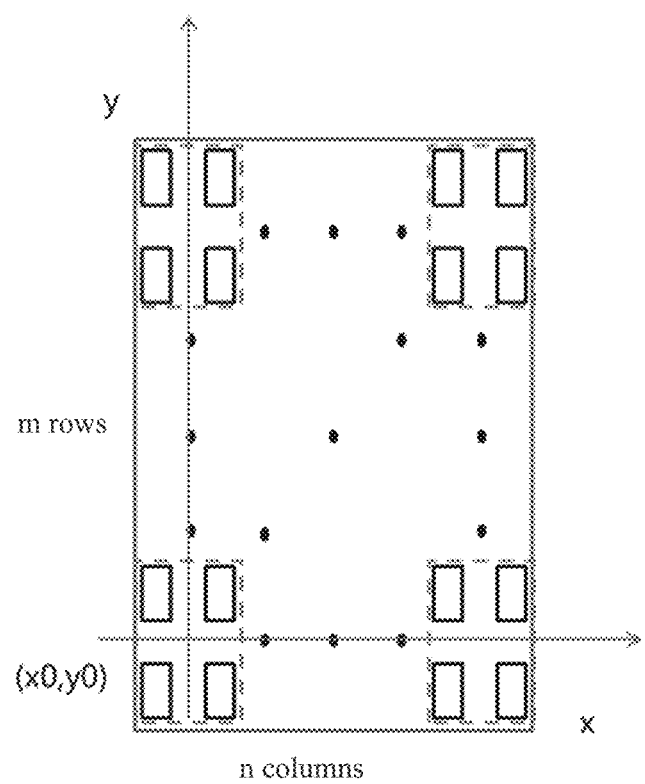
FIG. 9B is another schematic diagram of a mesh region of a mask in a rectangular coordinate system provided by at least one embodiment of the present disclosure.

For example, as shown in FIG. 9B, in this example, each region includes four first sub-openings, and a center of a region in the lower left corner of the mesh region can be used as the origin (x0, y0) of the rectangular coordinate system. The coordinates and dimensions of the first sub-openings in the regions in M rows and N columns in the rectangular coordinate system are recorded in the table. For example, Table 2 records the coordinates and dimensions of the plurality of first sub-openings in respective regions in the rectangular coordinate system. For example, taking the region at the lower left corner in FIG. 9B as a starting region, as shown in Table 2, the coordinates used to record the position information include a x coordinate and a y coordinate. For example, the x coordinate of the starting region is $x_{11}$ and the y coordinate of the starting region is $y_{11}$. The region in an m-th row and an n-th column (m is less than or equal to M and n is less than or equal to N) has an x coordinate of $x_{nm}$, and a y coordinate of $y_{nm}$. The dimension information includes a group distance Px of the region along the x direction (that is, a distance from a starting coordinate of a region to a starting coordinate of an adjacent region in the x direction) and a group distance Py of the region along the y direction (that is, a distance from a starting coordinate of a region to a starting coordinate of an adjacent region in the y direction). For example, the dimension information also includes the width w (that is, the dimension in e x direction) and the length h (that is, the dimension in the y direction) of the first sub-opening in the region, for example, the width of the first sub-opening in the starting region is $w_{11}$ and the length of the first sub-opening in the starting region is $h_{11}$, the width of the first sub-opening in the region in the n-th row and the m-th column is $w_{nm}$, and the length of the first sub-opening in the region in the n-th row and the m-th column is $h_{nm}$.

For example, the table also records the total number of rows $n_x$ and the total number of columns $n_y$ of the first sub-openings included in each region, and the expansion-contraction rate Tn in the x direction and the expansion-contraction rate Tm in the y direction of each region. For example, the expansion-contraction rate Tn and the expansion-contraction rate Tm of each region can be calculated according to the reverse compensation data of the corresponding position. For example, the expansion-contraction rate Tn of a region along the x direction is equal to a ratio of the dimension of the region after deforming along the x direction to the initial dimension of the region along the x direction, and the expansion-contraction rate Tm of the region along the y direction is equal to a ratio of the dimension of the region after deforming along the y direction to the initial dimension of the region along the y direction. For example, the dimension of a region after deforming along the x direction or y direction can be calculated by substituting the coordinates of the region in the above-mentioned deformation fitting formula.

For example, the x coordinate $x_{nm}$ and y coordinate of the region in the m-th column and n-th row can be calculated based on the expansion-contraction ratio Tn, the expansion-contraction ratio Tm, the group distance Px, the group distance Py, and the x coordinate $x_{11}$, and y coordinate $y_{11}$ of the starting region, respectively. The width $w_{nm}$ and length $h_{nm}$ of the first sub-opening in the region in the m-th column and n-th row can be calculated based on the expansion-contraction ratio Tn, the expansion-contraction ratio Tm, and the width $w_{11}$ and length $h_{11}$ of the starting region, respectively. The specific calculation formula is shown in Table 2.

Thus, the coordinates and dimensions of each region and the first sub-opening in each region can be obtained. For example, the coordinates (x, y) of each region represent the coordinates of a vertex or a center of the region in the rectangular coordinate system, as long as the coordinates (x, y) of each region can characterize the position of the region, and the embodiments of the present disclosure are not limited thereto.

TABLE 2

| | Coordinates of the starting region | Total number of columns&rows | Group distance | Expansion-contraction ratio | Coordinates of the region in m-th row and n-th column |
|---|---|---|---|---|---|
| x direction | $x_{11}$ | $n_x$ | Px | Tn | $x_{nm} = (x_{11} + (n - 1) \times Px) \times T(n)$ |
| y direction | $y_{11}$ | $m_y$ | Py | Tm | $y_{nm} = (y_{11} + (m - 1) \times Py) \times T(m)$ |

TABLE 2-continued

| | Dimension of the starting region | Total number of columns&rows | Group distance | Expansion-contraction ratio | Dimension of the region in m-th row and n-th column |
|---|---|---|---|---|---|
| x direction | $w_{11}$ | $n_x$ | Px | Tn | $w_{nm} = w_{11} \times T(n)$ |
| y direction | $h_{11}$ | $m_y$ | Py | Tm | $h_{nm} = h_{11} \times T(m)$ |

In a case of obtaining the target initial state information of the mesh region and recording the target initial state information of the mesh region in a table, the table can be sent to the manufacturer and the meaning of the data in the table can be explained with the manufacturer to enable the manufacturer to accurately obtain the manufacturing information of the mesh region of the mask. In this case, if the table is lost or leaked, it is difficult for the picker to understand the information recorded by the table, thus reducing the risk of secret leakage.

For example, in some embodiments, recording the target initial state information of the mesh region in the form of a graph includes: drawing a curve of the deformation amount of the mask relative to the test mask.

Figure 10:
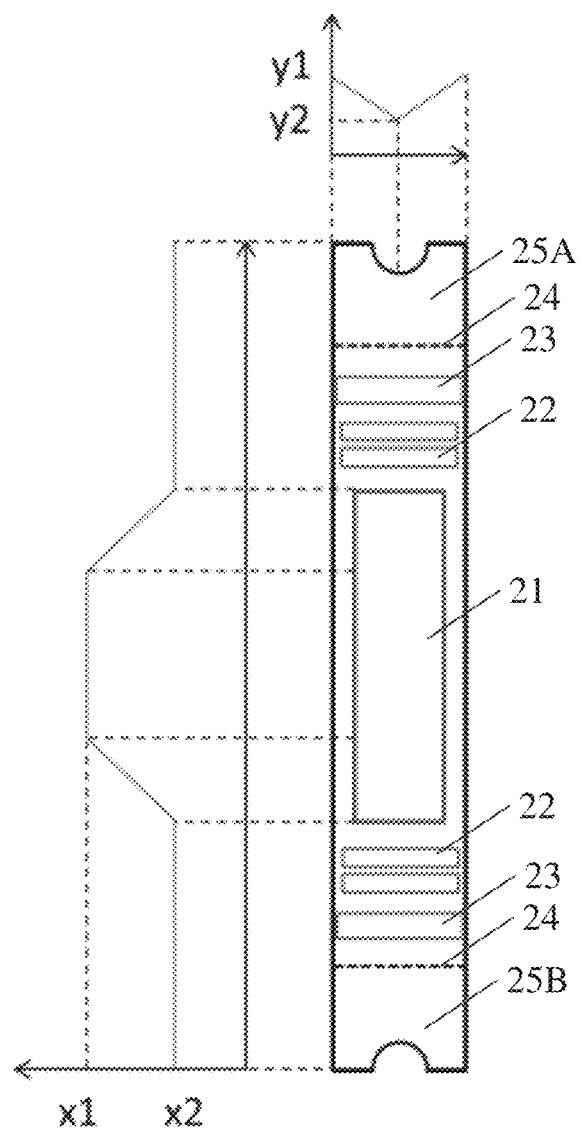
FIG. 10 is a schematic diagram of a drawing method for a mask provided by at least one embodiment of the present disclosure.

For example, as shown in FIG. 10, first, a drawing sheet of the test mask can be drawn, and then the compensation data, such as the offset directions and the offset amounts, of the mesh region of the target mask, obtained by designing and relative to the mesh region of the test mask, at various positions can be drawn on one side of the drawing sheet of the test mask. For example, in FIG. 10, the offset position can be read from the coordinate system, and the offset amount along the x direction is calculated from x1 and x2. For example, the offset amount along the x direction is equal to the absolute value of the difference between x1 and x2; the offset amount along the y direction is calculated from y1 and y2, for example, the offset amount along the y direction is equal to the absolute value of the difference between y1 and y2.

The method for indirectly drawing the drawing sheet of the mask does not directly express the specific shape and dimension information of the target mask. In a case of sending the drawing sheet to the manufacturer, the contents expressed in the drawing sheet can be explained to the manufacturer, so that the manufacturer can accurately obtain the manufacturing information of the mesh region of the mask. In this case, if the drawing sheet is lost or leaked, it is difficult for the picker to understand the information recorded by the drawing sheet, thus reducing the risk of secret leakage.

For example, in some embodiments, recording the target initial state information of the mesh region in the form of a graphic includes: directly drawing a drawing sheet of the target mask designed by the above method, for example, as shown in FIG. 8A, and the dimensions and the like of respective lines of the mask at various positions can be marked in the drawing sheet (not shown in the figure). In addition, the position, dimension, and the like of each first sub-opening in the mesh region of the mask can also be directly drawn, as shown in FIG. 8B. Therefore, the manufacturer can directly manufacture the mask according to the drawing sheet.

Step S104: manufacturing a mask according to the target initial state information.

For example, at least one mesh region of the mask manufactured is in a first shape.

For example, when recording the target initial state information using the above method of a table or a graph, the mask, such as the mask shown in FIGS. 8A and 8B, can be manufactured by mechanical processing (such as cutting, stamping) and other processes according to the information recorded in the table or graph.

Because the mask manufactured by the manufacturing method provided by at least one embodiment of the present disclosure is subjected to deformation compensation, in the process of stretching the mask to form the mask device, the mesh region of the mask is easier to align successfully, thereby improving the manufacturing efficiency of the mask device and making the manufacturing process proceed smoothly. Moreover, the mask device manufactured using the mask has higher precision. In a case where the mask device is used to manufacture a display substrate, the mesh region of the mask can be in a target shape, such as a regular rectangle shape, corresponding to the display region of the display substrate, the plurality of first sub-openings in the mesh region can be in target shapes corresponding to a plurality of pixel units in the display region and in a regular array distribution, so that the display substrate manufactured using the mask device has higher accuracy and does not appear dark spots, cross-color, and other defects.

At least one embodiment of the present disclosure provides a manufacturing method for a mask device, and the manufacturing method includes: providing a mask, which is obtained by the above manufacturing method, stretching the mask in a first direction, and fixing the mask to the mask frame by a welding method or the like, thereby manufacturing a mask device, for example, referring to the manufacturing process shown in FIGS. 3A-3D. The mask device includes a mask and a mask frame. For example, there may be a plurality of masks on a mask frame, and the mask device is used to manufacture a motherboard including a plurality of display substrates, and the embodiments of the present disclosure are not limited thereto.

At least one embodiment of the present disclosure also provides a mask, referring to FIG. 8A, the mask includes a first clamping region 35A and a second clamping region 35B, which are opposite to each other in the first direction, and at least one mesh region 31 between the first clamping region 35A and the second clamping region 35B, the mesh region 31 is in a first shape, in a case where the mask is stretched in the first direction, the mesh region 31 is in a target shape, and the target shape is different from the first shape. For example, the target shape may include a polygon shape (such as a rectangle shape), a circle shape, an ellipse shape, or the like. For example, the mask can be used to manufacture a display substrate. In this case, the target shape corresponds to a shape of the display region of the display substrate.

For example, the first shape includes: a first side and a second side, which extend substantially in the first direction and are oppositely arranged, and a third side and a fourth side, which are connected between the first side and the second side. The first side and the second side protrude toward a direction away from a center of the first shape, and the third side and the fourth side are recessed toward a direction close to the center of the first shape.

For example, in some embodiments, the target shape is a polygon shape, such as a regular polygon shape, such as a rectangle shape. For example, in one example, in a case where the target shape is a rectangle shape, the first shape of the mesh region before being stretched is a polygon shape as shown in FIG. 8A.

For example, as shown in FIG. 8A, in a case where the target shape is a rectangle shape, the first shape of the mesh region 31 before being stretched includes: a first side 311 and a second side 312, which at least partially extend along the first direction and are oppositely arranged. The first side 311 includes a first end 311A, a second end 311B, and a first midpoint 311C between the first end 311A and the second end 311B, the second side 312 includes a third end 312A, a fourth end 312B, and a second midpoint 312C between the third end 312A and the fourth end 312B, a connection line between the first midpoint 311C and the second midpoint 312C is a first connection line 315, the first connection line 315 is perpendicular to the first direction, the first end 311A, the second end 311B, the third end 312A, and the fourth end 312B respectively approach toward the inside of the first shape, so that a length of the first connection 315 is greater than a length of a connection line between the first end 311A and the third end 312A (i.e., the straight distance between the first end 311A and the third end 312A), in addition, the length of the first connection 315 is greater than a length of a connection line between the second end 311B and the fourth end 312B (that is, the straight distance between the second end 311B and the fourth end 312B).

The first shape further includes a third side 313 connecting the first end 211A to the third end 312A, and a fourth side 314 connecting the second end 311B to the fourth end 312B. A connection line between a midpoint 313A of the third side 313 and a midpoint 314A of the fourth side 314 is a second connection line 316, the midpoint 313A of the third side and the midpoint 314A of the fourth side respectively approach toward the inside of the first shape, so that a length of the second connection line 316 is less than a length of a connection line between the first end 311A and the second end 311B (that is, the straight distance between the first end 311A and the second end 311B), and the length of the second connection line 316 is also less than a length of a connection line between the third end 312A and the fourth end 312B (that is, the straight distance between the third end 312A and the fourth end 312B), and the second connection line 316 passes through a midpoint O of the first connection line 315. In some embodiments, the midpoint O is also the center of the first shape.

For example, in some embodiments, the total length of the mask is about 1000 mm to 1400 mm, such as 1200 mm, and the total width of the mask is about 50 mm to 500 mm, such as 100 mm or 300 mm. For example, the length of the mesh region 31 is about 600 mm to 900 mm, such as 800 mm, and the width of the mesh region 31 is about 20 mm to 500 mm, such as 100 mm.

Because the first end 311A, the second end 311B, the third end 312A, and the fourth end 312B are respectively recessed toward the inside of the first shape, the edge portion of the first side 311 and the edge portion of the second side 312 are inclined inward. According to this, the first shape can be divided into a plurality of portions, the portion of the first side 311 and the portion of the second side 312, which are parallel to each other, are called a middle portion (similar to a rectangular portion in the figure), an upper portion on the middle portion (similar to a positive trapezoidal portion in the figure) is a first portion, and the lower portion under the middle portion (similar to an inverted trapezoidal portion in the figure) is a second portion. For example, the ratio among the height (the length along the first direction) of the first portion, the height of the middle portion, and the height of the second portion is about 1:15:1~1:25:1, for example, 1:20:1.

For example, in a case where the target shape is a rectangle shape, the length of the target rectangle shape is A and the width of the target rectangle shape is B. In this case, the distance (straight distance) between the first end 311A and the third end 312B is, for example, about $(1+0.005\%) \times A \sim (1+0.025\%) \times A$, similarly, the distance (straight distance) between the second end 311B and the fourth end 312B is, for example, about $(1+0.005\%) \times A \sim (1+0.025\%) \times A$, and the distance between the first end 311A and the third end 312B and the distance between the second end 311B and the fourth end 312B may be the same or different. In this case, the length of the first connection line 315 is, for example, about $(1+0.0075\%) \times A \sim (1+0.125\%) \times A$. In the above expressions, X in $(1+X)$ (in the above expressions, X takes 0.005%, 0.025%, etc.) is the first compensation value ratio, for example, in the same mask, the ratio of the first compensation value ratio of the distance between the first end 311A and the third end 312B (or the first compensation value ratio of the distance between the second end 311B and the fourth end 312B) to the first compensation value ratio of the length of the first connection line 315 is about 1:15~1:5. For example, the distance (straight distance) between the first end 311A and the second end 311E is, for example, about $(1-0.007\%) \times B \sim (1-0.04975\%) \times B$, similarly, the distance (straight distance) between the third end 312A and the fourth end 312B is, for example, about $(1-0.007\%) \times B \sim (1-0.04975\%) \times B$, the distance between the first end 311A and the second end 311B and the distance between the second end 311B and the third end 312A and the fourth end 312B may be the same or different. In this case, the length of the second connection line 316 is, for example, about $(1-0.01\%) \times B \sim (1-0.05\%) \times B$. In the above expressions, Y in $(1-Y)$ (in the above expressions, Y takes 0.007%, 0.04975%, etc.) is the second compensation value ratio. For example, in the same mask, the ratio of the second compensation value ratio of the length of the second connection line 316 to the second compensation value ratio of the distance between the first end 311A and the second end 311B (or the second compensation value ratio of the distance between the third end 312A and the fourth end 312B) is about 1:0.7~1:0.995.

For example, according to different applications of the mask, for example, in a case of manufacturing display substrates of different sizes, various parameters of the mask, for example, parameters of the mesh region, can also be adaptively designed. The embodiments of the present disclosure do not specifically limit the parameters of the mask.

For example, in some embodiments, the mesh region includes a plurality of first sub-openings. In a case where the mesh region is in a target shape, the plurality of first sub-openings included in the mesh region are arranged in a regular array, such as the regular array shown in FIG. 5C. Therefore, in a case where the mask is used to manufacture a display substrate, the plurality of first sub-openings in the mesh region can more accurately correspond to a plurality of pixel units arranged in an array in the display region of the display substrate.

For example, in some examples, the plurality of first sub-openings included in the mesh region 31 are used to form one display substrate. In other embodiments, the plurality of first sub-openings included in the mesh region 31 are used to form a plurality of display substrates, in this case, these sub-openings may be divided into a plurality of groups, and each group is used to form one display substrate. The embodiments of the present disclosure do not limit the specific form of the plurality of first sub-openings in the mesh region 31.

For example, in some embodiments, the mask further includes a first dummy mesh region 32A and a second dummy mesh region 32B, the first dummy mesh region 32A is disposed between the first clamping region 35A and the mesh region 31, and the second dummy mesh region 32B is disposed between the second clamping region 35B and the mesh region 31. The first dummy mesh region 32A and the second dummy mesh region 32B can, for example, alleviate the force applied on the mesh region 31 during the stretching process, and prevent the mesh region from being excessively deformed.

For example, the mask may further include regions, such as welding regions 33 and cutting regions 34, and the embodiments of the present disclosure are not limited thereto.

Because the mask provided by at least one embodiment of the present disclosure is in a target shape after being stretched, in the process of stretching the mask to form the mask device, the mesh region of the mask is easier to align successfully, thereby improving the manufacturing efficiency of the mask device and making the manufacturing process proceed smoothly. Moreover, the mask device manufactured by using the mask has higher precision. In a case where the mask device is used to manufacture a display substrate, the mesh region of the mask can be in a target shape, such as a regular rectangle shape, corresponding to the display region of the display substrate, the plurality of first sub-openings in the mesh region can be in target shapes corresponding to a plurality of pixel units in the display region and in a regular array distribution, so that the display substrate manufactured by the mask device has higher accuracy and does not appear dark spots, cross-color, and other defects At least one embodiment of the present disclosure further provides a manufacturing method for a display substrate. The manufacturing method includes: forming at least one functional layer of the display substrate by using a mask device obtained by the above manufacturing method. The functional layer includes, for example, any functional layer having a certain pattern, such as a light emitting layer in a light emitting device of a display substrate. The display substrate manufactured by the manufacturing method has higher accuracy, and does not appear dark spots, cross-color, and other defects.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or a region may be enlarged or narrowed, that is, the drawings are not drawn in a real scale. However, it should be understood that, in the case in which a component such as a layer, film, region, substrate, or the like is referred to be "on" or "under" another component, the component may be directly on or under the another component or a component may be interposed therebetween.

(3) In case of no conflict, the embodiments of the present disclosure and features in the embodiments can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A manufacturing method for a mask, comprising:
providing a test mask, wherein the test mask comprises a first clamping region and a second clamping region, which are opposite to each other in a first direction, and further comprises at least one mesh region between the first clamping region and the second clamping region, the at least one mesh region is in a target shape,
acquiring deformation state information of the mesh region in a case where the test mask is stretched along the first direction,
acquiring reverse compensation information for the mesh region according to the deformation state information, and obtaining target initial state information of the mesh region based on the reverse compensation information, and
manufacturing a mask according to the target initial state information, and the at least one mesh region of the mask manufactured being in a first shape.

2. The manufacturing method according to claim 1, wherein the deformation state information comprises deformation modes and/or deformation amounts of the mesh region at a plurality of positions.

3. The manufacturing method according to claim 2, further comprising: fitting deformation curves of the mesh region in the first direction and in a second direction according to the deformation state information, wherein the second direction is perpendicular to the first direction.

4. The manufacturing method according to claim 3, wherein acquiring the reverse compensation information for the mesh region comprises:
obtaining the reverse compensation information according to the deformation curves.

5. The manufacturing method according to claim 4, wherein the reverse compensation information comprises deformation compensation values of the mesh region at the plurality of positions or deformation compensation curves of the mesh region in the first direction and in the second direction.

6. The manufacturing method according to claim 4, wherein the mesh region comprises a plurality of first sub-openings arranged in an array, and the manufacturing method further comprises:
acquiring reverse compensation information of each of the plurality of first sub-openings according to the reverse compensation information for the mesh region.

7. The manufacturing method according to claim 4, wherein the mesh region comprises a plurality of first sub-openings arranged in an array, the plurality of first sub-openings are divided into M×N regions, each region of the M×N regions comprises at least one first sub-opening, and M and N are positive integers greater than or equal to 2, the manufacturing method further comprises:
according to the reverse compensation information for the mesh region, obtaining reverse compensation information of the first sub-opening in each region.

8. The manufacturing method according to claim 1, further comprising: recording the target initial state information of the mesh region in a form of a table or a graph.

9. The manufacturing method according to claim 8, wherein the mesh region comprises a plurality of first sub-openings arranged in an array, and recording the target initial state information of the mesh region in the form of a table comprises:

establishing a rectangular coordinate system, and recording coordinates and dimensions of the plurality of first sub-openings in the rectangular coordinate system in a table.

10. The manufacturing method according to claim 9, wherein the mesh region comprises a plurality of first sub-openings arranged in an array, the plurality of first sub-openings are divided into M×N regions, each region of the M×N regions comprises at least one first sub-opening, and M and N are positive integers greater than or equal to 2, recording the target initial state information of the mesh region in the form of a table comprises:

establishing a rectangular coordinate system, and recording a coordinate and a dimension of the first sub-opening of each region in the rectangular coordinate system in a table.

11. The manufacturing method according to claim 8, wherein recording the target initial state information of the mesh region in the form of a graphic comprises:

drawing a curve of a deformation amount of the mask relative to the test mask.

12. The manufacturing method according to claim 1, wherein the deformation state information is obtained through a simulation method.

13. The manufacturing method according to claim 1, wherein the test mask is stretched in the first direction through the first clamping region and the second clamping region.

14. The manufacturing method according to claim 1, wherein the target initial state information of the mesh region comprises target initial shape information and target initial dimension information of the mesh region.

\* \* \* \* \*